United States Patent [19]

Mikata et al.

[11] Patent Number: 4,966,866
[45] Date of Patent: Oct. 30, 1990

[54] METHOD FOR MANUFACTURING SEMICONDUCTOR DEVICE HAVING GATE ELECTRODES OF DIFFERENT CONDUCTIVITY TYPES

[75] Inventors: Yuuichi Mikata, Kawasaki; Shuichi Samata, Yokohama, both of Japan

[73] Assignee: Kabushiki Kaisha Toshiba, Kawasaki, Japan

[21] Appl. No.: 399,213

[22] Filed: Aug. 29, 1989

[30] Foreign Application Priority Data

Nov. 22, 1988 [JP] Japan .................. 63-295420

[51] Int. Cl.$^5$ .................. H01L 21/78; H01L 27/00
[52] U.S. Cl. .................. 437/193; 437/34; 437/57
[58] Field of Search .................. 437/34, 57, 58

[56] References Cited

U.S. PATENT DOCUMENTS

| | | | |
|---|---|---|---|
| 4,463,491 | 8/1984 | Goldman et al. | 437/200 |
| 4,555,842 | 12/1985 | Levinstein et al. | 437/34 |
| 4,786,611 | 11/1988 | Pfiester | 437/162 |

FOREIGN PATENT DOCUMENTS

| | | |
|---|---|---|
| 54-000880 | 6/1979 | Japan . |
| 62-233931 | 9/1988 | Japan . |
| 2153146 | 8/1985 | United Kingdom . |

OTHER PUBLICATIONS

Mieno et al., "Selected Doped Polysilicon Growth Effect of Carbon on the Selective Doped Silicon Film Growth," J. Electrochem. Soc. Solid–State Science and Technology, vol. 134, No. 11, Nov. 1987.

*Primary Examiner*—Brian E. Hearn
*Assistant Examiner*—Laura M. Holtzman
*Attorney, Agent, or Firm*—Finnegan, Henderson, Farabow, Garrett and Dunner

[57] ABSTRACT

Disclosed is a method for manufacturing a semiconductor device, for example, an MOSFET. According to this method, an n-well region is formed in a predetermined portion of a p-type semiconductor substrate, after which a field oxide film is formed on that portion of the n-well region which is in contact with the p-type semiconductor substrate. Next, a gate oxide film is formed on the p-type semiconductor substrate and the n-well region, and when a polycrystal silicon film is formed on the field oxide film and the gate oxide film. Thereafter, a polycrystal silicon film containing boron is formed on that portion of the above polycrystal silicon film formed on the p-channel MOSFET forming region, a polycrystal silicon film containing phosphorus being formed on that portion of the polycrystal film formed on the n-channel MOSFET forming region. The above-mentioned three polycrystal silicon films are then patterned, thereby to form a p-type gate electrode including the polycrystal silicon on the gate oxide electrode and the polycrystal silicon containing boron, and an n-type gate electrode including the polycrystal silicon film on the gate oxide electrode and the polycrystal silicon film containing phosphorus.

11 Claims, 6 Drawing Sheets

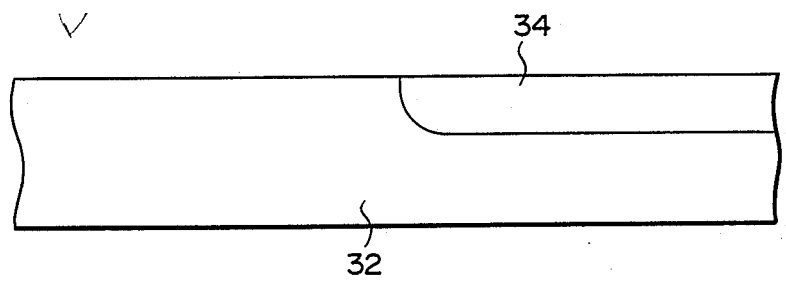
F I G. 2A
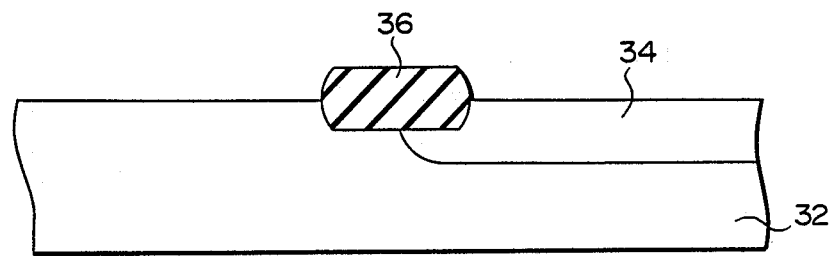
F I G. 2B
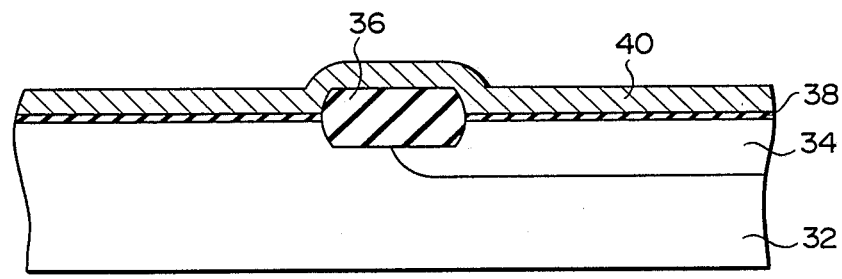
F I G. 2C

METHOD FOR MANUFACTURING SEMICONDUCTOR DEVICE HAVING GATE ELECTRODES OF DIFFERENT CONDUCTIVITY TYPES

BACKGROUND OF THE INVENTION

1. Field of the Invention

This invention relates to a method of manufacturing a semiconductor device, and more particularly, to a semiconductor device such as a MOS field effect transistor (FET) having gate electrodes of different conductivity types.

2. Description of the Related Art

A CMOS type semiconductor device is known which has two MOSFETs of different types, i.e., a p-channel type MOSFET and an n-channel type MOSFET. More specifically, the device comprises a p-type semiconductor substrate, an n-type diffusion layer (n-well region) formed in the substrate, and an $SiO_2$ film formed on the substrate and the n-well region and functioning as an element isolating region. The device further comprises gate electrodes formed on the substrate and the n-well region, each spaced a predetermined distance apart from the $SiO_2$ film, and source and drain regions formed between the $SiO_2$ film, and each of the gate electrodes.

In general, n-type polycrystal silicon containing phosphorus (P) or arsenic (As) as impurities is used to form the gate electrodes of MOSFETs. However, if the gate electrodes are 1 μm or less wide, it is then necessary to prevent the short channel effect which may result on account of the gate electrodes being of such narrow width. Thus, to prevent the occurrence of the short-channel effect, the gate electrode of the p-channel MOSFET must be made of p-type polycrystal silicon containing boron (B). Hence, the p-channel MOSFET must have a p-type gate electrode, and the n-channel MOSFET an n-type gate electrode.

Referring to FIGS. 1A though 1F, it will now be described how the above-mentioned conventional CMOS semiconductor device is manufactured.

First, as shown in FIG. 1A, n-type diffusion layer 14 is formed in that portion of p-type semiconductor substrate 12 where a p-type gate electrode (mentioned later) is to be formed.

Then, as shown in FIG. 1B, $SiO_2$ film 16, or an element isolating region, is formed on that portion of n-type diffusion layer 14 which is in contact with p-type semiconductor substrate 12.

Next, as shown in FIG. 1C, thermal oxide film 18, or a gate insulating film, is formed on p-type semiconductor substrate 12 and n-type diffusion layer 14. Thereafter, polycrystal silicon 20, or a gate electrode, is formed on thermal oxide film 18 and $SiO_2$ film 16.

Further, as shown in FIG. 1D, resist pattern 22 is formed such that it covers that region where an n-channel MOSFET is to be formed (the left half of FIG. 1D). Then, boron ions are injected into that portion of polycrystal silicon film 20 where a p-channel MOSFET is to be formed (the right half of FIG. 1D). Similarly, arsenic ions are injected into that portion of polycrystal silicon film 20 where the n-channel MOSFET is to be formed.

Next, $SiO_2$ film 24 is formed on polycrystal silicon film 20 by the CVD (chemical vapor deposition) method. Then, gate electrodes 20a and 20b are patterned as shown in FIG. 1E. In addition, resist pattern 26 is formed such that it covers the region where the n-channel MOSFET is to be formed. Subsequently, boron ions are injected into the p-channel MOSFET in a self-aligning manner.

Thereafter, as shown in FIG. 1F, source and drain region 28 is formed by annealing. Similarly, arsenic ions are injected into the n-channel MOSFET, and source and drain region 30 is formed. Then, resist pattern 26 and $SiO_2$ film 20 formed on gate electrodes 20a and 26b are removed. As a result, a p-channel and an n-channel MOSFET are produced according to the prior art method.

In the above-described prior art method for producing a semiconductor device, the impurity is doped into polycrystal silicon film 20 by means of ion injection. If polycrystal silicon film 20 is relatively thick, e.g., 2000 Å or more, semiconductor substrate 12 will not be affected by the ion injection. However, if the width of the gate electrode is 1 μm or less, this necessitates polycrystal silicon 20 being proportionally thin, with the result that the impurity will inevitably diffuse through film 20 and into semiconductor substrate 12, and degrades the characteristics of the MOSFET.

As has been described above, in the prior art, the impurity ions are injected into the polycrystal silicon film functioning as a gate electrode. Consequently, the narrower and thinner the gate electrode is, the greater the degradation of the characteristics of the resultant MOSFET.

SUMMARY OF THE INVENTION

Accordingly, it is the object of the present invention to provide a method of manufacturing a semiconductor device in which a p-type gate electrode is formed in a p-channel MOSFET and an n-type gate electrode is formed in an n-channel MOSFET, and the characteristics of the MOSFET's are not adversely affected by impurity doping, even when the gate electrodes are narrow and thin.

According to an aspect of the present invention, there is provided a method of manufacturing a semiconductor device having gate electrodes of different types, comprising the steps of: forming, in a predetermined portion of a semiconductor substrate of one conductive type, a diffusion layer of an opposite conductive type; forming a first insulating film on the semiconductor substrate, at a portion in contact with the diffusion layer; forming a second insulating film on the semiconductor substrate and the diffusion layer; forming a first conductive film on the first and second insulating films; forming a second conductive film of the one conductive type on a predetermined portion of the first conductive film; forming a third conductive film, of the opposite conductive type, on the remainder of the first conductive film; forming a first gate electrode of the one conductive type including the first and second conductive films, and a second gate electrode of the opposite conductive type including the first and third conductive films.

BRIEF DESCRIPTION OF THE DRAWINGS

The aforementioned aspects and other features of the present invention are explained in the following description, taken in connection with the accompanying drawings wherein:

FIGS. 2A through 2J are cross sectional views showing, in sequence, the steps of manufacturing a semiconductor device according to an embodiment of the present invention.

DETAILED DESCRIPTION OF THE PREFERRED EMBODIMENTS

Figure 1A:
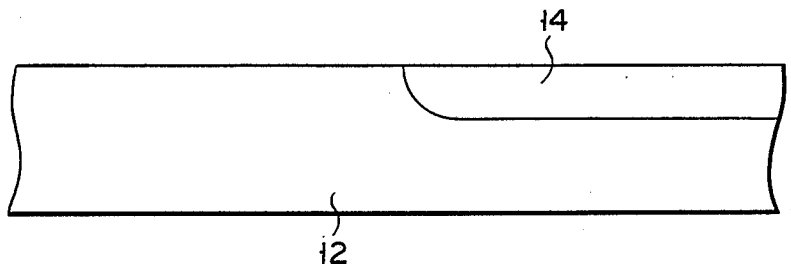
FIGS. 1A through 1F are cross sectional views showing, in sequence, the steps of manufacturing a semiconductor device according to the prior art method.
Figure 1B:
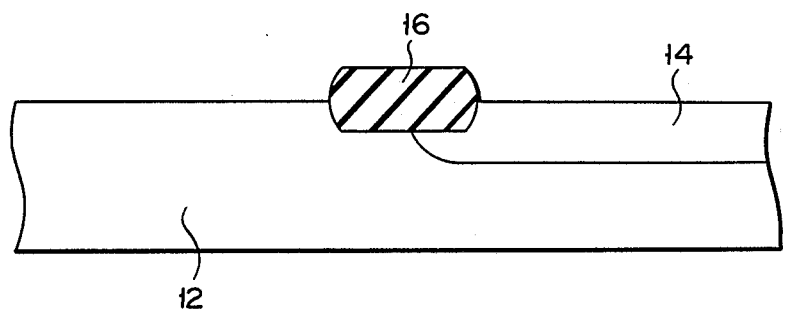
Figure 1C:
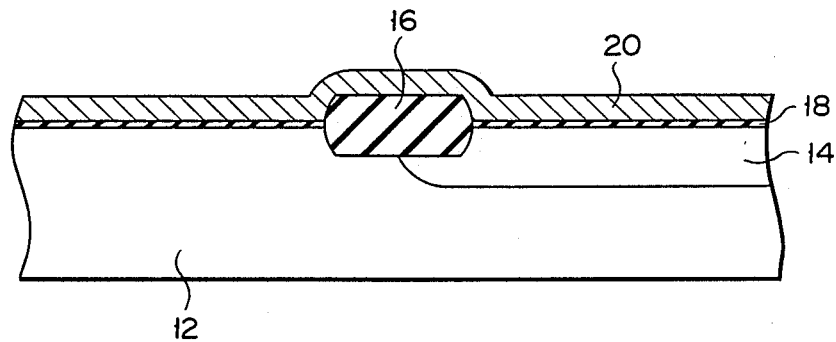
Figure 1D:
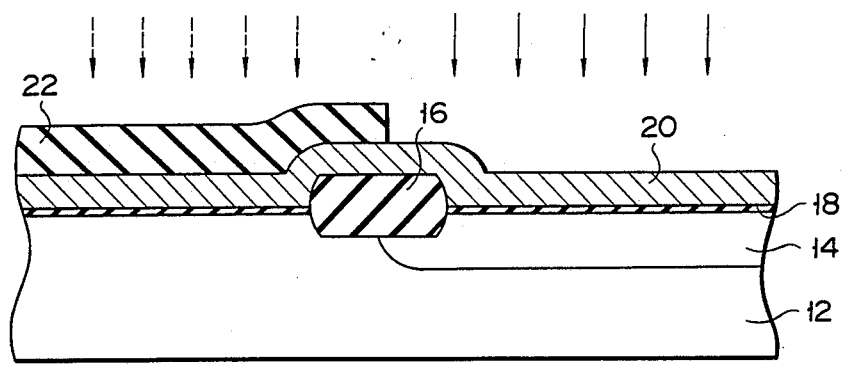
Figure 1E:
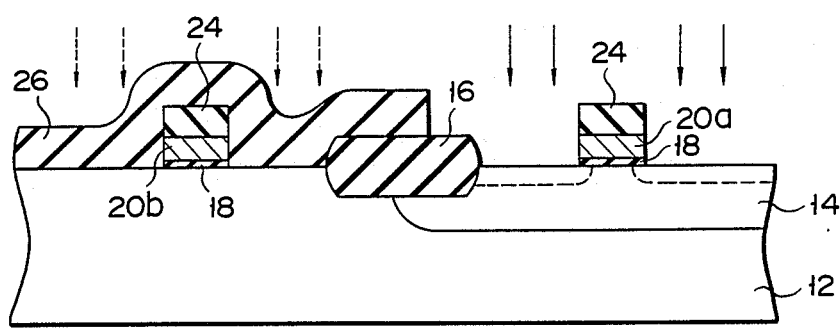
Figure 1F:
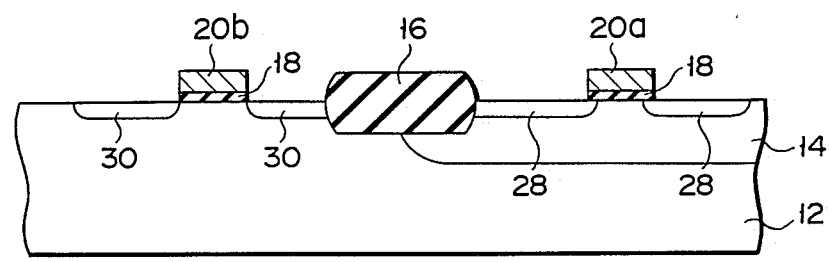

As described above, FIGS. 2A through 2J show, in sequence, the steps of manufacturing a semiconductor device according to an embodiment of the present invention, and which is used in a CMOS.

First, as shown in FIG. 2A, n-type diffusion layer (n-well region) 34 is formed in p-type semiconductor substrate 32 made of Si (111) of 4-5 Ω·cm at a portion where a p-type electrode (mentioned later) is to be formed. The n-well region is formed in a predetermined portion of substrate 32 by annealing at 1200 Å for three hours, after phosphorus (P) ions are injected under the conditions of 100 KeV and $1 \times 10^{13}$ cm$^{-2}$.

Next, as shown in FIG. 2B, field oxide film 36 is formed on that portion of n-well region 34 which is in contact with p-type semiconductor substrate 32, film 36 being formed as an element isolating region by means of a conventional selective oxidation technique, so as to have a thickness of 1.2 μm.

Then, as shown in FIG. 2C, gate oxide film 38 having a thickness of 100 Å is formed by thermal oxidation on p-type semiconductor substrate 32 and n-well region 34. Subsequently, polycrystal silicon film 40 having a thickness of 500 Å is formed by means of the LP (low pressure) CVD method over the entire surface of semiconductor substrate 32 including gate oxide film 38 and field oxide film 36. In this embodiment, polycrystal silicon film 40 contains a p- or n-type impurity having a concentration of $1 \times 10^{19}$ cm$^{-3}$ or less; alternatively, it may contain no impurity.

Figure 2D:
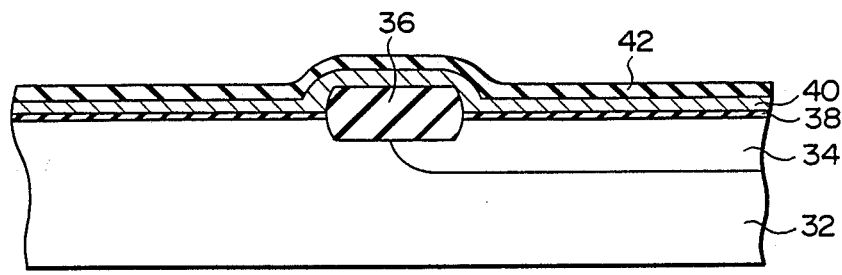

As shown in FIG. 2D, SiO$_2$ film 42 having a thickness of 100 Å is formed by means of the CVD method, on the entire surface of polycrystal silicon film 40 thus formed.

Figure 2E:
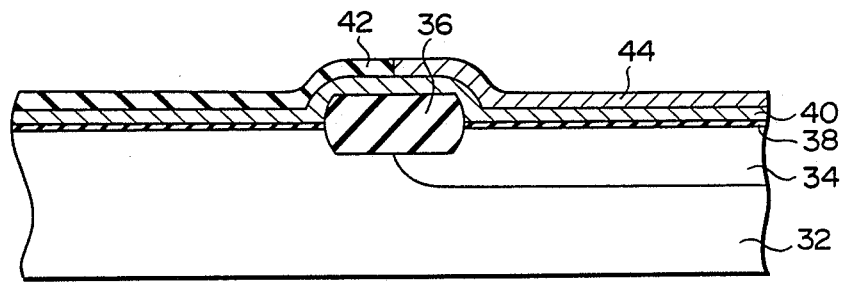

Subsequently, as shown in FIG. 2E, that portion of SiO$_2$ film 42 which is formed on a p-channel MOSFET forming region is removed by photolithography, followed by RIE (reactive ion etching). Thereafter, the LPCVD method is executed under conditions of 850° C., SiCl$_2$H$_2$ (500 cc/min.), HCl(1l/min.), and B$_2$H$_6$ (10 cc/min.), and as a result, polycrystal silicon film 44 including boron (B) and having a thickness of 1000 Å is formed on the exposed polycrystal silicon film 40 (in the right half of FIG. 2E). The concentration of B contained in polycrystal silicon film 44 is preferably $1 \times 10^{20}$ cm$^{-3}$ or greater.

Figure 2F:
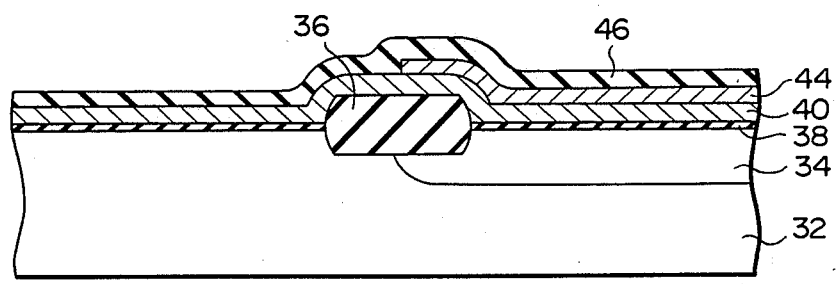
Figure 2G:
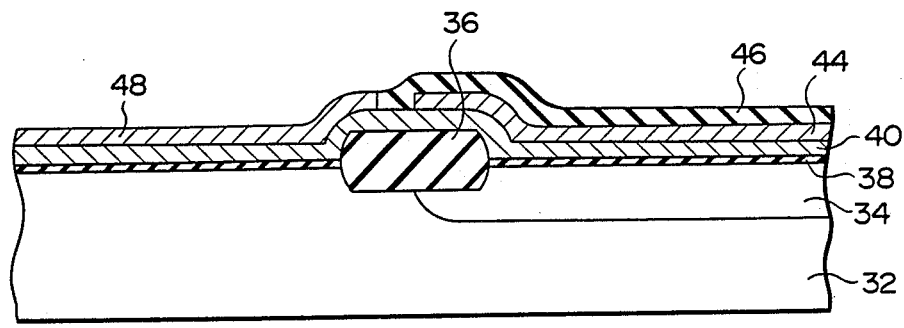

Next, as shown in FIG. 2F, a portion of SiO$_2$ film 42, which is formed on the n-channel MOSFET forming region, is removed by etching and then SiO$_2$ film 46 having a thickness of 1000 Å is formed, by means of the CVD method, over the entire surface of polycrystal silicon films 40 and 44.

Thereafter, a portion of SiO$_2$ film 46, which is formed on an n-channel MOSFET forming region, is removed by photolithography, followed by RIE. Thereafter, the LPCVD method is executed under conditions of 850° C., SiCl$_2$H$_2$ (500 cc/min.), HCl (1l/min.), and PH$_3$ (10 cc/min.), as a result of which, polycrystal silicon film 48 including P and having a thickness of 1000 Å is formed on the exposed polycrystal silicon film 40 (in the left half of FIG. 2G). The concentration of P contained in polycrystal silicon film 48 is preferably $1 \times 10^{20}$ cm$^{-3}$ or greater, similar to the level of concentration of B contained in polycrystal silicon film 44.

Figure 2H:
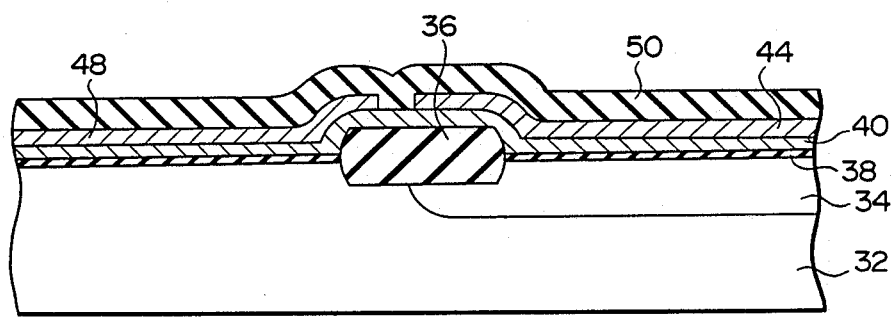
Figure 2I:
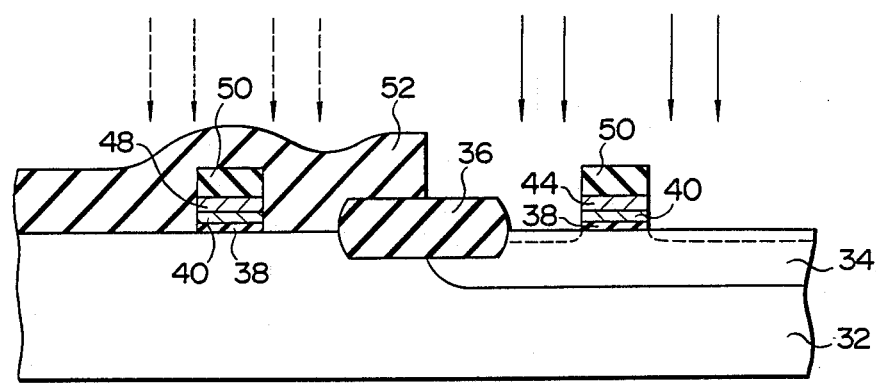

Then, as shown in FIG. 2H, after all of the SiO$_2$ film 46 is removed, SiO$_2$ film 50 is formed by means of the CVD method, covering polycrystal silicon films 40, 44, and 48.

Thereafter, the patterning of gate electrodes is performed, by means of photolithography and RIE resulting in the removal of all of SiO$_2$ film 50 except for those portions where the gate electrodes are formed. Then, the n-channel MOSFET forming region is covered by SiO$_2$ film 52. Thereafter, B ions of $1 \times 10^{15}$ cm$^{-2}$ are injected into the p-channel MOSFET forming region, As ions of $1 \times 10^{15}$ cm$^2$ being injected into the n-channel MOSFET forming region, with the gate electrode in each case functioning as a mask. (See FIG. 2I.)

Figure 2J:
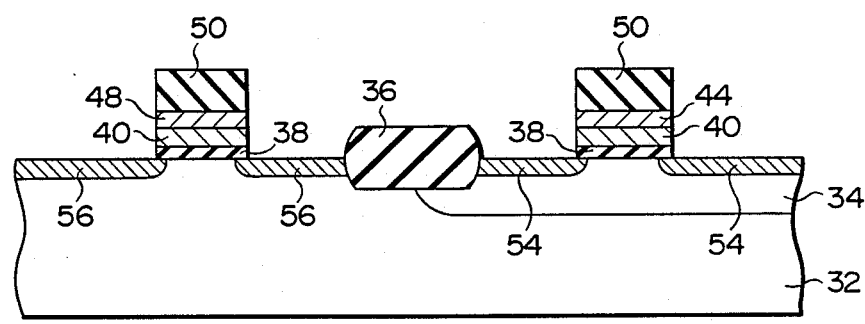

Next, by means of additional annealing, source and drain regions 54 and 56 are formed on n-well region 34 and p-type semiconductor substrate 32, respectively, as shown in FIG. 2J. This is the final manufacturing step involved in the production of the p-channel and n-channel MOSFETs.

According to the method described above, polycrystal silicon films containing p-type and n-type impurities are formed in alternate fashion on predetermined portions of the substrate, thereby forming gate electrodes of different conductivity types. As a result, this method does not have the drawback wherein the characteristics of the MOSFET are degraded, as in the case of the conventional ion injection method, when the gate electrode is thin. In addition, using the above method, one photolithography step and one etching step can be omitted, with the result that the time required to manufacture the semiconductor device of the invention is shorter than in the prior art.

What is claimed is:

1. A method of manufacturing a semiconductor device having gate electrodes of different conductivity types, comprising the steps of:

forming, in a predetermined portion of a semiconductor substrate of one conductive type, a diffusion layer of an opposite conductive type;

forming a first insulating film on said semiconductor substrate, at that portion in contact with said diffusion layer;

forming a second insulating film on said semiconductor substrate and said diffusion layer;

forming a first conductive film on said first and second insulating films;

forming a second conductive film of said one conductive type on a predetermined portion of said first conductive film;

forming a third conductive film, of said opposite conductive type, on the remainder of said first conductive film; and performing a predetermined patterning of said first, second, and third conductive films, thereby forming a first gate electrode, of said one conductive type, including the first and second conductive films, and a second gate electrode, of said opposite conductive type, including said first and third conductive films.

2. A method according to claim 1, wherein said second and third conductive films have a higher impurity concentration than said first conductive film.

3. A method according to claim 2, wherein said second and third conductive films have an impurity concentration $1 \times 10^{20}$ cm$^{-3}$ or more.

4. A method according to claim 2, wherein said first conductive film has an impurity concentration $1 \times 10^{19}$ cm$^{-3}$ or less.

5. A method according to claim 2, wherein said first conductive film contains no impurity.

6. A method according to claim 2, wherein said second conductive film contains boron.

7. A method according to claim 2, wherein said third conductive film contains phosphorus.

8. A method according to claim 1, wherein the thickness of said first conductive film is 500 Å.

9. A method according to claim 1, wherein the thickness of each of said second and third conductive films is 1000 Å.

10. A method according to claim 1, wherein the thickness of said second insulating film is 100 Å.

11. A method according to claim 1, further comprising the steps of:

forming a third insulating film on said first conductive film;

removing that portion of said third insulating film where said second conductive film is to be formed on said first conductive film;

removing that portion of said third insulating film where said second conductive film is not to be formed, after said second conductive film is formed;

forming a fourth insulating film on said first and second conductive films;

removing that portion of said fourth insulating film where said third conductive film is to be formed on said first conductive film; and forming a fifth insulating film on said second and third conductive films, after said third conductive film is formed;

said step of performing said predetermined patterning being the removal of said fifth insulating film.

* * * * *